July 16, 1968 G. SONNENSCHEIN 3,392,439

METHOD AND MATERIALS FOR OBTAINING LOW-RESISTANCE BONDS
TO TELLURIDE THERMOELECTRIC BODIES
Filed Oct. 28, 1963

INVENTOR.
GEORGE SONNENSCHEIN
BY Henry Kolin
ATTORNEY

United States Patent Office 3,392,439
Patented July 16, 1968

3,392,439

METHOD AND MATERIALS FOR OBTAINING LOW-RESISTANCE BONDS TO TELLURIDE THERMOELECTRIC BODIES

George Sonnenschein, Los Angeles, Calif., assignor to North American Rockwell Corporation, a corporation of Delaware Filed Oct. 28, 1963, Ser. No. 319,301
7 Claims. (Cl. 29—573)

Figure 1:
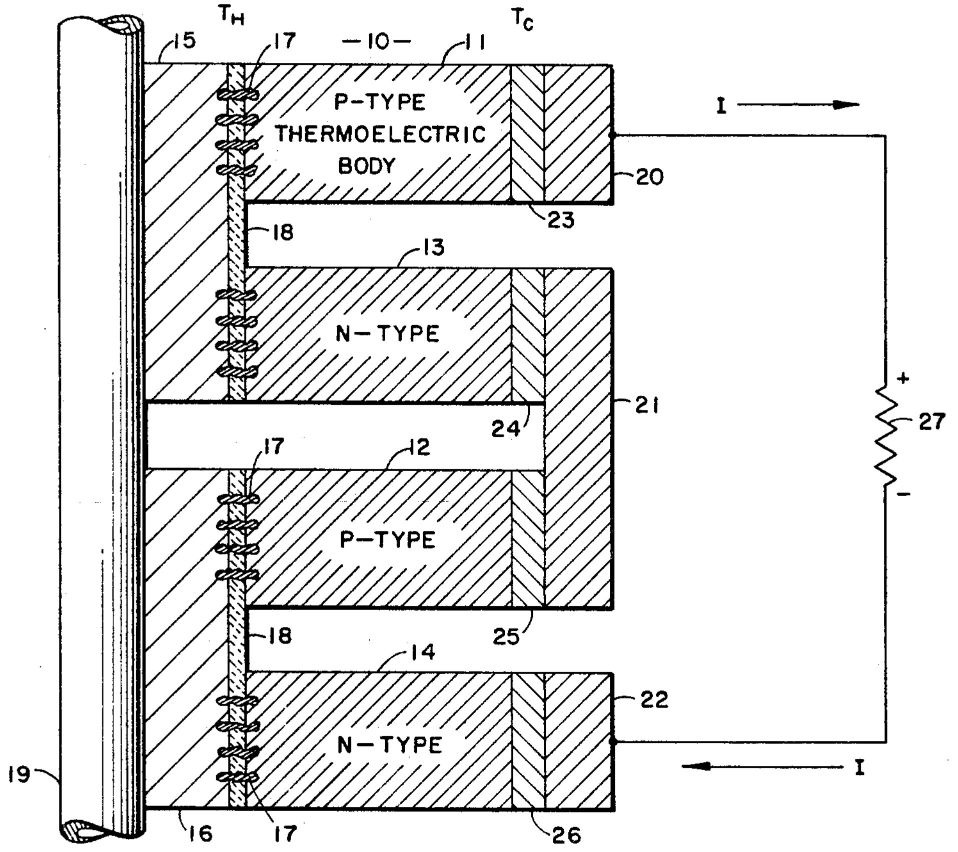

This invention relates to improved thermoelectric devices and to methods of fabricating such devices. More particularly, the invention relates to improved materials and methods for obtaining mechanically strong, thermally stable, low-resistance contacts to thermoelectric bodies. Still more particularly, the invention relates to a method for bonding aluminum to lead telluride.

Thermoelectric components or circuit members are made of semiconducting bodies of thermoelectric materials such as lead telluride, bismuth telluride, antimony telluride, germanium telluride, lead tin telluride, silver indium telluride, silver gallium telluride, copper gallium telluride, silver antimony telluride, sodium manganese telluride, and the like. Small amounts of various additives or doping agents may be incorporated in the thermoelectric composition to modify the thermal conductivity, electrical conductivity, or electrical polarity of the material.

Thermoelectric devices which convert heat energy directly into electrical energy do so by means of the Seebeck effect. That is, when heat is applied to one junction of a thermoelectric device, while the other junction is cooled, an electrical potential is produced proportional to the thermoelectric power of the thermoelements employed and to the temperature difference between the junctions.

Generally two thermoelectric circuit members or components are bonded to a block of metal, which may, for example, be aluminum, copper, or iron, to form a thermoelectric junction. The two members are of thermoelectrically complementary types: one member is made of P-type thermoelectric material and the other of N-type thermoelectric material. Whether a particular thermoelectric material is designated N-type or P-type depends upon the direction of conventional current flow across the cold junction of a thermocouple formed by the thermoelectric material in question and a metal, such as copper or lead, when the thermocouple is operating as a thermoelectric generator according to the Seebeck effect. If the conventional current in the external circuit flows from the thermoelectric material, then the material is designated as "P-type"; if the current in the external circuit flows toward the thermoelectric material, then the material is designated as "N-type." The present invention relates to both P-type and N-type thermoelectric materials. These materials consist of the binary and ternary semi-conducting alloys of tellurium. Preferably the binary telluride alloys such as lead telluride, bismuth telluride, antimony telluride, and germanium telluride are employed as the thermoelectric materials. Particularly preferred because of their desirable thermoelectric and physical properties are lead telluride and bismuth telluride.

A good thermoelectric material should have a high electrical conductivity and a low thermal conductivity since the electromotive force generated in energy converters of this type utilizing the Seebeck effect is dependent upon the temperature difference between the hot and cold junctions. The generation of Joulean heat in the thermoelectric device due to the electrical resistance of either the thermoelectric members, the auxiliary components, or the electrical contacts to the two members will reduce the efficiency of the device.

Heretofore, there has been considerable difficulty in the joining of thermoelectric semi-conductor elements into arrays of suitable voltage and power output. This difficulty has been particularly pronounced in forming a satisfactory bond between the thermoelectric element and the conductive material at the hot junction, particularly where this hot junction is operated at an elevated temperature such as found in a nuclear reactor. The conductive material to be bonded to the semiconductor material must satisfy a varied set of stringent requirements, namely, low electrical resistivity, high thermal conductivity, thermal expansivity closely matching that of the semiconductor, low vapor pressure, melting point well above the maximum operating temperature of the device, and, particularly, chemical and atomic or electronic compatibility with the semiconductor. By chemical compatibility or stability, I refer to the fact that the conductive material and the thermoelement being joined do not form an intermetallic compound of higher resistivity than either material, thereby resulting in a high-resistance contact. Chemical instability may also occur in other forms. For example, the electrode material may alloy with the thermoelement in a eutectic reaction which lowers the melting point of the alloyed layer; or the conductive electrode material may diffuse into the thermoelement forming second phase highly conductive material which causes local short circuiting of the thermoelectric element; or the electrode material may react directly with the thermoelectric alloy to destroy its molecular form; or the electrode material may dissolve a doping agent to effectively leach it out of the thermoelement.

By atomic or electronic compatibility, I refer to the fact that the conductive material does not "poison" the semiconductor thermoelement; that is, no deterioration occurs in the thermoelectric power of the thermoelement by the transfer of charge carriers between the thermoelement and the conductive material. Thus, the electrode material may diffuse into the thermoelement where it may form donor or acceptor sites to alter the local carrier concentration. For example, a conductive material containing arsenic would ordinarily be unsatisfactory for use with a semiconductor such as germanium telluride because pentavalent arsenic would act as a donor of charge carriers to the germanium, which could deleteriously affect the thermoelectric properties of the germanium telluride.

Because of this multiplicity of varying and often conflicting requirements, it is frequently necessary to match the conductive material and the semiconductor in accordance with the more stringent of the requirements, and compromise with regard to those of secondary importance, such as thermal and electrical conductivities. Aside from the melting-point consideration, the fundamental requirements to be met by a satisfactory ohmic bond relate to the chemical and atomic compatibilities, as well as a matching of the coefficient of thermal expansion. These conditions severely restrict the choice of conductive materials for forming a juncture with a given semiconductor.

Other difficulties arise in that intermediate layers of high resistivity are encountered in many junctions where oxidized surfaces are brought together without adequate removal of the oxide layer. Most of the thermoelements of practical use today form thin surface oxide layers immediately upon exposure to air and must be properly treated to remove such oxides before a good contact can be formed.

Accordingly, it is an object of the present invention to provide improved thermoelectric devices.

Another object of the invention is to provide improved methods for obtaining mechanically strong, low-resistance electrical connections to thermoelectric bodies.

A further object of the invention is to provide improved methods for obtaining mechanically strong, thermally stable, low-resistance electrical bonds between a thermoelectric body and a metal body.

Still another object of the invention is to permit the utilization of a variety of conductive materials solely on the basis of their thermomechanical and electrical properties without regard to their chemical or atomic compatibility with the semiconductor.

In accordance with the invention, a barrier layer and conductive tungsten granules are provided between the thermoelectric body and the conductive body, which are both compatible with the tungsten granules. Then the facing surfaces of these bodies are contacted under pressure so that the particles or granules consisting principally of tungsten penetrate the barrier layer, forming low-resistance ohmic conductive paths for the conduction of an electric current between the telluride thermoelectric body and the conductive body through the barrier layer. The conductive body is selected so as to be chemically compatible with the tungsten granules used. The thermal expansion coefficient of tungsten granules need not match those of either the conductive body, the thermoelectric telluride body, or the barrier layer. For example, if the thermal expansivity of the tungsten granules is less than that of the conductive and thermoelectric materials, and the temperature at which the junction is formed is higher than the device operating temperature, residual compressive stresses set up around each penetrating granule may well enhance the mechanical and electrical integrity of the bond.

Advantageously, by means of the present invention a mechanically strong, low-resistance, thermally stable contact may be made to thermoelectric bodies without regard as to whether the conductive body is chemically or atomically compatible with the thermoelectric body. By means of this technique, a considerable variety of conductive materials may now be utilized for forming mechanically strong, low-resistance bonds with thermoelectric semiconductors. Heretofore, the only means for avoiding chemical or atomic incompatibility between a conductive body and a thermoelectric body, particularly for high temperature contacts, would be to interpose specific brazing alloys between the thermoelectric body and the conductive body to bond these bodies together. However, most known brazing alloys act as poisons for the thermoelectric body, thereby deleteriously affecting its thermoelectric properties, or serve to increase the electrical conductivity of the contact, or are otherwise unsuitable.

It has been found, in accordance with the present invention, that conductive tungsten granules are particularly suitable and preferred for bonding a material consisting principally of aluminum, such as pure aluminum or an aluminum alloy, to a lead telluride thermoelectric body where an aluminum oxide film has been formed on the aluminum as a barrier layer. These conductive tungsten granules are superior to other conductive granules in giving a lesser increase in resistivity on pressing, and in maintaining their high conductivity values after repeated thermal cycling.

Figure 2:
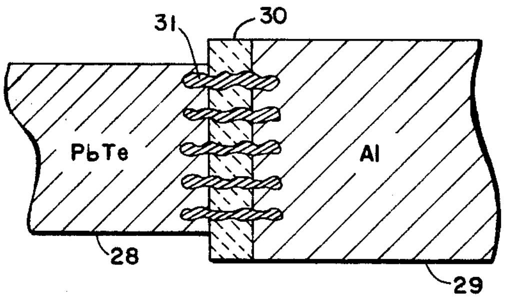

The invention will be described in greater detail by the following example in conjunction with the accompanying drawings in which:

FIGURE 1 is a cross-sectional view of a thermoelectric Seebeck device comprising a plurality of thermoelectrically complementary thermoelements bonded in series arrangement to metal plates in accordance with a first embodiment of the invention; and FIGURE 2 is a cross-sectional view of a lead telluride thermoelectric body bonded by tungsten granules to an aluminum body in accordance with a specific and preferred embodiment of the invention.

Referring to FIG. 1, the thermoelectric device 10 comprises thermoelectric bodies 11 and 12, which may, as illustrated, be P-type, and complementary type thermoelectric bodies 13 and 14, which in this example are N-type, as illustrated in the drawing. While various telluride thermoelectric bodies may be used in accordance with this invention, preferably the thermoelectric bodies are binary telluride alloys, particularly lead telluride. It will be understood that the conductivity types of thermoelectric bodies 11 and 12 and those of bodies 13 and 14 may be reversed. One end of thermoelectric bodies 11 and 13 and one end of bodies 12 and 14, which pairs are of opposite conductivity type, are bonded respectively to conductive bodies 15 and 16, which preferably are metal plates of aluminum, copper, or stainless steel. Inasmuch as conductive bodies 15 and 16 need not be chemically or atomically compatible with the thermoelectric bodies, because of the manner of bonding in accordance with this invention, these metal plates are selected primarily on the basis of having a melting point above that of the temperature of operation of the thermoelectric device, a suitable thermal conductivity, and a thermal coefficient of expansion closely matching that of the thermoelectric bodies. Accordingly, any of various metals or alloys may be used for conductive bodies 15 and 16 provided they are also chemically compatible with conductive tungsten granules 17, shown in exaggerated form for purposes of illustration, which are used to bond the thermoelectric bodies to the conductive bodies. The selection of the thermoelectric and conductive bodies is governed in part by the consideration that the tungsten granules must form low-resistance contacts with the conductive bodies 15 and 16; that is, the tungsten granules must be chemically compatible with these conductive bodies. The formation of high-resistivity intermetallic compounds with the tungsten must be avoided. This may be readily determined experimentally or by reference to binary alloy phase diagrams of tungsten.

The relative stability of the tungsten and of a semiconductor material may be determined by referring to thermochemical data. Where the reaction between the semiconductor and tungsten is characterized by a negative free energy change (as given by the Gibbs-Helmholtz equation), the reaction tends to proceed with a release of energy so that the semiconductor is not stable with respect to the tungsten. Where the free energy change for the reaction of the semiconductor with the tungsten is zero or positive, the reaction will not proceed and the semiconductor may be considered to be stable in contact with the tungsten.

Where thermochemical data are lacking, the relative stability of a thermoelement in contact with the tungsten may be ascertained experimentally by annealing the combination at a temperature greater than the maximum temperature to be encountered in the application. After the annealing a recheck of the electrical characteristics will indicate whether the tungsten has reacted with the thermoelement to change the electrical characteristics. Metallographic examination of a sectioned semiconductor-tungsten interface will indicate whether significant interdiffusion exists. Similar techniques may be used to determine whether significant interaction between the tungsten granules and the conductive body may occur.

The term "tungsten granules," unless otherwise indicated, includes granules of pure tungsten and of those alloys in which tungsten is predominant. The tungsten granules are hard particulate materials which melt at a temperature above the operating temperature of the thermoelectric device. The granules may be of regular shape, such as spherical shot, or may be irregularly shaped. Suitably, the granules will be between 10 and 400 mesh, U.S. Standard Sieve particle size, and preferably between 200 and 400 mesh in size. The granular particles are of sufficient hardness to penetrate the chemically and electrically inert barrier layers 18, which are either genetically derived from conductive bodies 15 and 16 or constitute an artificial barrier layer interposed between the conductive and thermoelectric bodies. Although barrier layers 18 are shown as coextensive with the surfaces of conductive bodies 15 and 16, the barrier layers may also be derived from the thermoelectric bodies. For example, many thermoelements form thin surface oxide layers, which may serve as barrier layers in the practice of this invention. Thus, in the practice of this invention, barrier layers may be present on either or both of the surfaces of the conductive and thermoelectric bodies.

By the term "genetically derived" I refer to layers, coatings, or films formed on a surface of either or both of the conductive body and the thermoelectric body by chemical reaction with the material comprising this body. For example, where conductive bodies 15 and 16 are plates of aluminum or an aluminum alloy, a genetically derived, thin aluminum oxide coating will be rapidly formed on the surfaces of the aluminum, particularly at elevated temperatures under oxidizing conditions. The tungsten granules will penetrate this layer to form low-resistance ohmic paths between the aluminum plate and the thermoelectric body. Similarly, a passivated iron oxide film may be genetically formed where the metals plates are of iron. Alternatively, a vitreous, adhering material such as titanium silicide may be deposited on conductive bodies 15 and 16 to form barrier layers 18.

The barrier layer is essentially a chemically and electrically inert high-resistance layer which prevents the movement of charge carriers therethrough or chemical interaction between the thermoelectric and conductive bodies. It is an artificial layer, or is genetically derived from either or both of the thermoelectric and conductive bodies. Its presence allows for forming stable bonds between conductive bodies and thermoelectric bodies which may be chemically or atomically incompatible, without the occurrence of electronic deterioration of the thermoelectric bodies or the formation of high-resistance contacts between the thermoelectric and conductive bodies. While the thickness of the barrier layer is not critical per se, the layer must, of course, be penetrable by the conductive tungsten granules. Flms varying in thickness between a few tenths of a mil and several hundred mils are contemplated.

In the operation of thermoelectric device 10, conductive bodies 15 and 16 are heated to a temperature $T_H$ and become the hot junction of the device. Where the thermoelectric device 10 is used to convert heat given off in a nuclear reactor to electrical energy, the heat source from a nuclear reactor cooled by liquid sodium may be the liquid sodium flowing through electrically insulated pipe 19. Metal plates 20, 21, and 22, which respectively contact one end of thermoelectric bodies 11, 12–13, and 14 are maintained at a cold junction temperature $T_c$, which is lower than the temperature $T_H$ of the hot junction of the device.

In the embodiment shown in FIG. 1, it is assumed that the cold junction temperature is below 180° C., and therefore metal plates 20, 21, and 22 are shown as being connected to the thermoelectric bodies by the use of the ordinary soft solder of commerce, namely the lead-tin eutectic, which melts at about 180° C. Where the lower or cold junction temperature is below 180° C., for example at room temperature, this soft solder will form an adequate low-conductivity bond. It is, of course, assumed that the solder bonds 23, 24, 25, and 26, which serve to bond the metal plates to the thermoelectric bodies, are chemically and electronically compatible with the materials being joined. At the cold junction, problems of compatibility and the matching of thermal expansion coefficients are ordinarily much less severe and critical than those present at the hot junction. Further, it should be understood that the bonding method of this invention used for joining the thermoelectric and conductive bodies for the hot junction may equally well be utilized for the cold junction bonding.

A temperature gradient is thus established in each of thermoelements 11–14 from a high temperature adjacent plates 15 and 16 to a low temperature adjacent plates 20, 21, and 22. The electromotive force developed under these conditions produces in the external circuit a flow of conventional current (I) in the direction shown by arrows in FIG. 1; that is, the current flows in the external circuit from the P-type thermoelement 11 toward the N-type thermoelement 14, through a load shown as a resistance 27 in the drawing.

*Example 1*

The present invention may be utilized in its preferred aspects to provide a particularly desirable mechanically strong, low-resistance electrical bond between lead telluride and aluminum. Referring to FIG. 2, a body of lead telluride 28 is shown as a semiconductor thermoelement. Lead telluride has properties which make it particularly attractive for use as a thermoelectric element. It has a relatively low thermal conductivity, which gives a high temperature differential between the hot and cold junctions. Its electrical resistivity can be low enough to permit high current flow with low potential. Slight departures from stoichiometry do not adversely affect these electrical and thermal characteristics. Lead telluride can be doped readily with lead iodide to form a negative (N-type) material or with sodium metal to form a positive (P-type) material. By arranging the positive and negative elements in couples and connecting the couples in series, as shown in FIG. 1, the potential voltages obtainable can be increased to a useful value.

On the other hand, lead telluride presents problems in fabrication into useful shapes in that it has relatively low tensile and compressive strengths and a very high coefficient of thermal expansion. These properties, together with its low thermal conductivity, make the material very susceptible to rupture from mechanical and thermal shock. Typical properties of lead telluride are shown below in Table I.

TABLE I.—PHYSICAL PROPERTIES OF LEAD TELLURIDE

| | | |
|---|---|---|
| Density (g./cc.) | 8.25 | |
| Coefficient of thermal expansion (/° C.) | $18\times10^{-6}$ | |
| Compressive strength (p.s.i.) | 10,000 | |
| Tensile strength (p.s.i.) | 1,000 | |
| Young's modulus (p.s.i.) | $2\times10^{6}$ | |
| | N | P |
| Thermal conductivity (w./cm.-° C.) | 0.024 | 0.019 |
| Electrical resistivity (75° F.) (microhms/in.) | 112 | 192 |

A conductive body of aluminum 29 would appear attractive as an end cap material for lead telluride thermoelectric elements because the thermal expansion of aluminum closely matches that of lead telluride, it has a low density making for lightweight units, and it has excellent thermal and electrical conductivities. Also, because the hot junction temperature that may be employed is close to that of the melting point of aluminum, the ensuing semi-plastic resilient state of the aluminum tends to have a cushioning effect on the lead telluride elements, protecting them against rupture. However, the presence of a thin aluminum oxide film 30, which readily forms on the aluminum surface, results in a high contact resistance. Further, conventional welding techniques for joining the aluminum and lead telluride, involving the use of fluxes and high-temperature brazing alloys, result in degradation of the electrical properties of the junction.

In accordance with the invention, it was found that a low-resistance non-degradative contact could be formed between the aluminum 29 and the lead telluride 28 by first embedding tungsten granules 31, shown in exaggerated form for purposes of illustration, of approximately 320 mesh particle size in a P-type or N-type lead telluride body or P-type lead tin telluride body by either cold pressing or hot pressing these tungsten granules at a temperature of about 1400–1600° F. at about 4000–5000 p.s.i. against the faces of the lead telluride bodies. On hot pressing these tungsten-containing lead telluride bodies against the aluminum end caps 29 at 1000–3000 p.s.i. at a temperature of 900–1100° F. for about a minute, thereby piercing the aluminum oxide film 30 present, thermoelectric elements of low resistance were obtained.

The resistance of representative P- and N-type elements before and after bonding is shown in Table II below:

TABLE II.—RESISTANCE OF LEAD TELLURIDE ELEMENTS HAVING TUNGSTEN-IMPREGNATED ALUMINUM END CAPS

| Sample No. | Resistance (microhms) | | Increase (percent) |
|---|---|---|---|
| | Before Hot Pressing | After Hot Pressing | |
| 1 | [1] 668 | 1,247 | 87 |
| 2 | [1] 630 | 930 | 48 |
| 3 | [1] 660 | 998 | 51 |
| 4 | [2] 175 | 306 | 75 |
| 5 | [2] 167 | 270 | 62 |
| 6 | [2] 172 | 295 | 72 |

[1] P-type.
[2] N-type.

Bismuth telluride is a useful and efficient thermoelectric material, closely resembling lead telluride in many of its thermoelectric and physical properties, and may be used in place of lead telluride in the foregoing example. When bismuth telluride $Bi_2Te_3$) is employed as a P-type thermoelectric material, thermal electromotive forces of +60 to +180 mv./°C. and resistivities as low as .0008 to .0012 ohm-cm. are obtained. In addition, the deviation from the Wiedemann-Franz-Lorenz ideal for thermoelectric materials is less than 2.7 (or a W.-F.-L. number of $6.615\times10^{-8}$ volts²/deg. C.); this means that P-type bismuth telluride has an extremely low thermal conductivity. N-type bismuth telluride has a thermal electromotive force of −170 to −200 mv./° C. and a resistivity of .0008 to .0006 ohm-cm.; its deviation from the W.-F.-L. ideal is les than 3 or a W.-F.-L. number of $7.35\times10^{8}$ volts²/deg. C.

*Example 2*

Doped lead telluride of both P- and N-type was cold pressed and sintered, and then tungsten granules of 320 mesh particle size were hot pressed into the thermoelement faces at 5000 p.s.i.g. and at a temperature of 1450° F. for the P-type and 1550° F. for the N-type for 1 minute. The tungsten-impregnated thermoelements were pressed to oxide-coated aluminum caps at 2000 p.s.i.g. and 1000° F. for 1 minute. A satisfactory low-resistance capped thermoelement was obtained.

*Example 3*

Using a similar type of doped lead telluride as used for Example 2, similarly cold pressed and sintered, the thermoelectric elements were pressed to oxide-coated aluminum end caps with an intermediate layer of 320 mesh tungsten granules in a single operation at 2000 p.s.i.g. at 1000° F. for 1 minute. Satisfactory low-resistance capped thermoelements resulted.

*Example 4*

Using the same type of doped lead telluride as used for Example 2, the thermoelements were formed by hot pressing at 5000 p.s.i.g. and at a temperature of 1450° F. for the N-type and 1550° F. for the P-type elements. Tungsten granules of 320 mesh particle size were then hot pressed into the thermoelements faces at a pressure of 5000 p.s.i.g. and at a temperature of 1450° F. for the P-type thermoelements and at 1550° F. for the N-type thermoelements for 1 minute. These tungsten-impregnated elements were then pressed to oxide-coated aluminum caps at 2000 p.s.i.g. and 1000° F. for 1 minute. Satisfactory low-resistance capped thermoelements were obtained.

*Example 5*

Using the same type of doped lead telluride as in the previous examples, thermoelements were prepared by hot pressing with 320 mesh particle-size tungsten at the end faces at 5000 p.s.i.g. and a temperature of 1450° F. for the N-type and 1550° F. for the P-type thermoelements. The tungsten impregnated elements were pressed to oxide-coated aluminum caps at 2000 p.s.i.g. and 100° F. for 1 minute. Satisfactory low-resistance capped thermoelements were obtained.

Two sets of 3-couple modules were assembled from elements fabricated by the process variant of this example. The cold resistance of modules 1 and 2 after bonding were 2800 and 3230 microhms, respectively. These modules were mounted in bell jars under a partially exhausted inert atmosphere, and unilaterally heated. Heat rejection at the cold side was by a set of blackened aluminum fins.

The first module was subjected to controlled thermal cycling, 4 hours on, 1 hour off, with an average hot junction temperature of 902° F. and an average cold junction temperature of 525° F. After 1000 hours, the resistance of the module had increased by about 60%.

The second module was thermally cycled in a random manner for 700 hours and then controllably cycled at 4 hours on, 1 hour off. The average hot junction temperature was about 900° F., with an average cold junction temperature of about 350° F. The increase in resistance of this module after 1000 hours was less than that for the first module. The life tests therefore show that the modules were thermally stable, the Seebeck voltage remaining relatively constant under both steady state and thermal cycling conditions.

The process of the present invention is readily adaptable to commercial production. For example, lead telluride pellets, 0.500" in diameter by 0.170" long may be prepared on a production basis in accordance with this invention by using hot-pressing techniques with 5-layer, 12-cavity graphite dies, 60 capped pellets being obtained with each pressing operation. Preferably, an inert atmosphere such as argon or helium is present during the hot-pressing operation to prevent oxidation of the pellets. The number of dies used is determined in part by the size of the press and the length of the furnace. In general, the pellets and metal contacts with prior-embedded granules are loaded into the die cavity, and graphite spacers are used to separate the element assemblies from each other. Pressure is transmitted to the pellets by the use of graphite plungers. A Nichrome-wound resistance furnace on a hydraulic press is suitable. Optimally, a pressure of 4,000 p.s.i. at a temperature between 1100 and 1200° F. for 5 to 10 minutes is used for the hot-pressing, but this may be varied depending on the number of layers and cavities employed and the furnace characteristics.

It will be understood that the embodiments described above are by way of example only, and are not intended as limitations on the invention. Various modifications and variations may be made without departing from the spirit and scope of the instant invention. For example, while the term "conductive body" has been illustrated by the use of pure metals and metallic alloys, the term will also be applicable to low resistivity semiconductor materials. That is, in accordance with the process of this invention, two semiconductor bodies may be bonded together by the use of conductive tungsten granules. Similarly, when reference is made to aluminum, the aluminum alloys in which aluminum is a predominant component are also contemplated and include aluminum prepared by powder metallurgy techniques; in place of copper, any of the well known brasses of commerce may be used. Similarly, the term "iron" includes iron alloys, for example, the cast and wrought irons and stainless steels.

While the particulate granules are preferably first embedded in the metal plate by either cold pressing or hot pressing followed by hot pressing of the plate with a semiconductor, other methods of practicing the invention may be used. For example, the barrier layer and the granules may be disposed between the thermoelectric body and the conductive body, and all may be joined together in a single operation by hot pressing the entire assemblage. Or the tungsten bridging material may be in the form of an assemblage of brush-like fine tungsten wires embedded in an aluminum matrix and protruding through the oxide layer for bonding to the thermoelectric elements. Other variations will equally well suggest themselves to those skilled in this art. Accordingly, the scope of the invention is to be limited only in accordance with the objects and claims thereof.

I claim:

1. The method of bonding a telluride thermoelectric body to a conductive body to provide low resistance electrical contacts between said bodies comprising the steps of disposing a barrier layer and conductive tungsten granules between facing surfaces of the bodies to be joined, and contacting said surfaces while applying pressure thereto to bond said bodies and penetrate said barrier layer by said conductive tungsten granules, thereby forming low-resistance conductive paths between said bodies through said barrier layer.

2. The method of bonding a telluride thermoelectric body to a conductive body to provide low resistance electrical contacts between said bodies comprising the steps of providing an adherent barrier layer on a surface of the conductive body, disposing conductive tungsten granules between the barrier-layer-containing surface of the conductive body and a surface of the thermoelectric body, and contacting said surfaces while applying pressure thereto to bond said bodies and penetrate said barrier layer by said conductive tungsten granules, thereby forming low-resistance conductive paths between said bodies through said barrier layer.

3. The method of bonding a telluride thermoelectric body to a conductive body to provide low resistance electrical contacts between said bodies comprising the steps of forming a barrier layer on a surface of the conductive body, said barrier layer being genetically derived from the material of said conductive body, disposing conductive tungsten granules between the barrier layer surface of the conductive body and a surface of the thermoelectric body, and contacting said surfaces while applying pressure thereto to bond said bodies and penetrate said barrier layer by said conductive tungsten granules, thereby forming low-resistance conductive paths between said bodies through said barrier layer.

4. The method of bonding a telluride thermoelectric body to a conductive body of material to provide low resistance electrical contacts between said bodies comprising the steps of forming a barrier layer on a surface of the conductive body, said barrier layer being genetically derived from the material of said conductive body, pressing conductive tungsten granules against said barrier layer to penetrate it and embed said granules in said conductive body to form low-resistance conductive paths therewith, and containing the surface of the conductive body containing the tungsten granules with a surface of the thermoelectric body while applying pressure thereto to bond said bodies, the tungsten granules forming low-reristance conductive paths between said bodies through said barrier layer.

5. The method of bonding a thermoelectric body consisting essentially of a binary telluride semiconductor to a conductive body consisting principally of aluminum to provide low resistance electrical contacts between said bodies, at least a surface of said conductive body having a genetically derived barrier layer thereon, comprising the steps of pressing conductive tungsten granules against said barrier layer to penetrate it and embed said tungsten granules in said conductive body to form low-resistance conductive paths therewith, and contacting the surface of the conductive body containing the tungsten granules with a surface of the thermoelectric body while applying pressure thereto to bond said bodies, the tungsten granules forming low-resistance conductive baths between said bodies through said barrier layer.

6. The method of bonding a lead telluride thermoelectric body to provide low resistance electrical contacts between said bodies to an aluminum body, the aluminum body having a surface thereof covered with a genetically derived aluminum oxide barrier layer, comprising the steps of pressing conductive tungsten granules against the barrier layer to penetrate it and embed said granules in said conductive body to form low-resistance conductive paths therewith, and contacting the surface of the aluminum body containing the tungsten granules with a surface of the lead telluride body while applying pressure thereto to bond said bodies, the tungsten granules forming low-resistance conductive paths between said bodies through said barrier layer.

7. The process according to claim 6 wherein the bonding of said bodies is accomplished at a pressure between 2,000 and 5,000 p.s.i. and at a temperature between 900 and 1100° F.

References Cited

UNITED STATES PATENTS

| | | | |
|---|---|---|---|
| 3,080,261 | 3/1963 | Fritts et al. | 136—201 X |
| 2,244,109 | 6/1941 | Klein | 29—459 |
| 2,627,649 | 2/1953 | Matthysse | 136—201 |
| 3,210,831 | 10/1965 | Johnson et al. | 29—155.71 |

WILLIAM I. BROOKS, *Primary Examiner.*

WINSTON A. DOUGLAS, JOHN F. CAMPBELL, *Examiners.*

L. J. WESTFALL, A. W. BEKELMAN, *Assistant Examiners.*